United States Patent
Gonska et al.

(10) Patent No.: US 9,593,011 B2
(45) Date of Patent: Mar. 14, 2017

(54) MICROMECHANICAL COMPONENT AND METHOD FOR PRODUCING A MICROMECHANICAL COMPONENT

(75) Inventors: Julian Gonska, Reutlingen (DE); Heribert Weber, Nuertingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1102 days.

(21) Appl. No.: 13/318,435

(22) PCT Filed: Apr. 7, 2010

(86) PCT No.: PCT/EP2010/054584
§ 371 (c)(1),
(2), (4) Date: Nov. 1, 2011

(87) PCT Pub. No.: WO2010/139499
PCT Pub. Date: Dec. 9, 2010

(65) Prior Publication Data
US 2012/0045628 A1    Feb. 23, 2012

(30) Foreign Application Priority Data

Jun. 2, 2009   (DE) .................. 10 2009 026 628

(51) Int. Cl.
*B81B 1/00* (2006.01)
*B81C 1/00* (2006.01)
*B81B 7/00* (2006.01)

(52) U.S. Cl.
CPC ........ *B81C 1/00269* (2013.01); *B81B 7/0029* (2013.01); *B81C 2203/019* (2013.01); *B81C 2203/0118* (2013.01); *B81C 2203/035* (2013.01); *Y10T 428/24802* (2015.01)

(58) Field of Classification Search
CPC combination set(s) only.
See application file for complete search history.

(56) References Cited

U.S. PATENT DOCUMENTS

| 5,668,033 A | 9/1997 | Ohara et al. | |
| 5,801,313 A * | 9/1998 | Horibata et al. | 73/718 |
| 2002/0180031 A1* | 12/2002 | Yamaguchi | B81B 7/0064 257/704 |
| 2004/0259325 A1* | 12/2004 | Gan | B81B 7/007 438/456 |
| 2009/0079037 A1 | 3/2009 | Weber et al. | |

(Continued)

FOREIGN PATENT DOCUMENTS

| CN | 1935630 | 3/2007 |
| CN | 101154634 | 4/2008 |

(Continued)

*Primary Examiner* — Gerard Higgins
*Assistant Examiner* — Sathavaram I Reddy
(74) *Attorney, Agent, or Firm* — Gerard Messina

(57) ABSTRACT

A method is described for producing a micromechanical component. The method includes providing a first substrate, providing a second substrate, developing a projecting patterned element on the second substrate, and connecting the first and the second substrate via the projecting patterned element. The method provides that the connecting of the first and the second substrate includes eutectic bonding. Also described is a micromechanical component, in which a first and a second substrate are connected to each other.

6 Claims, 13 Drawing Sheets

(56) References Cited

U.S. PATENT DOCUMENTS

2010/0181676 A1* 7/2010 Montez .............. B81C 1/00269
                                                         257/771

FOREIGN PATENT DOCUMENTS

| DE | 196 19 921 | 12/1996 |
| DE | 10 2007 044806 | 4/2009 |
| JP | 57-126132 | 8/1982 |
| JP | 2007-57394 | 3/2007 |
| WO | WO 02/42716 | 5/2002 |
| WO | WO 2008/034233 | 3/2008 |

* cited by examiner

MICROMECHANICAL COMPONENT AND METHOD FOR PRODUCING A MICROMECHANICAL COMPONENT

FIELD OF THE INVENTION

The present invention relates to a micromechanical component and a method for producing a micromechanical component, a first and a second substrate being connected to each other.

BACKGROUND INFORMATION

Micromechanical components which are used in the automotive field, as inertial or acceleration sensors, for example, normally have a micropattern having movable functional elements. The micropattern is also designated as a MEMS structure (microelectromechanical system). During the operation of such sensors, the deflection of a functional element is detected, for instance, by a change in the electrical capacity compared to a fixed reference electrode.

Usual methods for producing a micromechanical component include forming the micropattern on a functional substrate (sensor wafer) and connecting the functional substrate to a cap substrate (capping). A cavity is formed, in this manner, which encloses the functional element, whereby the functional element is sealed hermetically from the environment. A specified gas atmosphere or pressure atmosphere may also be set in the cavity.

One method for capping a functional substrate is discussed in German document DE 10 2007 044 806 A1. In this method, the cap substrate is developed to have a projecting, tenon-shaped patterned element. The functional substrate is provided having an opening, which functions as a counter-pattern for the projecting patterned element of the cap substrate. The two substrates are connected so that the tenon-shaped pattern of the cap substrate engages in the opening of the functional substrate, and in this manner a sealing region encircling the micropattern is formed. Furthermore, a connecting medium is inserted into the sealing area, so as to produce a hermetically sealed connection. In this instance, the use of Sealglas is suggested, which is applied onto the conical pattern with the aid of a silk-screen mask before producing the connection with the functional substrate.

One development that may be observed in microsystems technology is the increasing miniaturization of the components. This brings about the tendency, besides the functional patterns, of also embodying the connecting areas (connecting frames and bonding frames) of micromechanical components to be smaller and narrower. The application of Sealglas, described above, with the aid of a silk-screen mask in this instance, however, increasingly bumps up against limits and therefore seems unsuitable for satisfying the (future) miniaturization requirements. In addition, the opening, developed on the functional substrate according to German document DE 10 2007 044 806 A1, has a rectangular shape in cross section, which may bring about the problem of insufficient adhesion.

SUMMARY OF THE INVENTION

An object of the exemplary embodiments and/or exemplary methods of the present invention is to state an improved method for producing a micromechanical component. A further object of the exemplary embodiments and/or exemplary methods of the present invention is to make available an improved micromechanical component.

This object is attained by a method according to the description herein, a micromechanical component according to the description herein and a micromechanical component according to the description herein. Further advantageous specific embodiments of the present invention are provided in the further description herein.

A method for manufacturing micromechanical component is also provided, according to the present invention. The method includes providing a first substrate, providing a second substrate, developing a projecting patterned element on the second substrate, and connecting the first and the second substrate via the projecting patterned element. The method is distinguished in that the connecting of the first and the second substrate includes eutectic bonding.

Carrying out the eutectic bonding method provides the opportunity of realizing a connecting region between the two substrates of the micromechanical component, having relatively small geometric dimensions, and particularly, having a small width. The projecting patterned element of the second substrate additionally makes possible the breaking up of oxide layers during the connecting of the substrates, which might be present on the surfaces or layers (bonding partners) that are to be connected. In this way, the eutectic reaction, that makes the connection possible, is able to occur relatively rapidly.

According to one specific embodiment, the projecting patterned element of the second substrate is developed having a connecting layer. During the connecting of the first and the second substrate, the connecting layer of the second substrate and the material of the first substrate form a eutectic alloy. Since only a connecting layer is being developed, this specific embodiment is realized in a relatively simple manner.

According to an alternative specific embodiment, a first connecting layer is developed on the first substrate. The projecting patterned element of the second substrate is developed having a second connecting layer. During the connecting of the first and the second substrate, the first and the second connecting layer form a eutectic alloy.

According to a further specific embodiment, the projecting patterned element of the second substrate is developed to have a protective layer on which the abovementioned connecting layer or rather the second connecting layer is formed. The protective layer is used to prevent the melting of the material of the projecting patterned element under the protective layer during the connecting of the first and the second substrate. In this way, the ratio of the mixture of the eutectic alloy formed within the scope of bonding is able to be set exactly so as to effect reliable adhesion between the first and the second substrate.

In this connection, the connecting layer of the projecting patterned element may have two layers situated one over the other, having different materials. The use of the two-layer connecting layer offers the possibility of improving the adhesion and stability of connection with respect to the protective layer.

According to a further specific embodiment, an opening is developed on the first substrate. The first and the second substrate are connected in such a way that the projecting patterned element of the second substrate engages with the opening of the first substrate. It is possible, thereby, to produce the bonding connection between the first and the second substrate so as to have great stability. In particular, a great connecting stability can be achieved with respect to forces, or rather shearing forces, acting laterally between the substrates.

According to another specific embodiment, the opening of the first substrate includes a floor region and side walls. Bordering on the floor region, the side walls have recesses into which an eutectic alloy flows that is formed during the eutectic bonding. In this way, a wedge fastening or a tooth construction may be effected, whereby the stability of the bonding connection may be further improved.

According to still another specific embodiment, an elevating pattern is developed in a connecting region on the first substrate or on the projecting patterned element of the second substrate. The elevating pattern may function, in this case, as a "sealing lip", which may run as a narrow and traversing structure within the connecting region or the bonding frame. In this way, there is the possibility of preventing the appearance of only local contacts between the surfaces or bonding partners, that are to be connected, based on differences of topography between the substrates. At the beginning of bonding, a melting of the structure may occur in the region of the elevating pattern. Because of a pressing together of the substrates carried out within the scope of the bonding, and the great surface contact pressure generated in this context in the vicinity of the elevating pattern, the locally created melt may be displaced, and the elevating pattern situated in the connecting region may be pressed further into the "melting front" being created. For this reason, contact of the bonding partners and the development of a eutectic alloy also in the remaining bonding frame vicinity may occur, because of which a hermetically sealed bonding connection may be produced.

Furthermore, a micromechanical component is also proposed, according to the present invention. The micromechanical component has a first and a second substrate. The second substrate has a projecting patterned element via which the first and the second substrate are connected. The micromechanical component is distinguished by the connection of the first and the second substrate being produced by a eutectic alloy formed by eutectic bonding in the vicinity of the projecting patterned element. Because of this, there is the possibility that the micromechanical component has a connecting region between the two substrates having relatively small geometric dimensions.

According to one specific embodiment, the first substrate has an opening. The first and the second substrate are connected in such a way that the projecting patterned element of the second substrate engages with the opening of the first substrate. In this embodiment, the micromechanical component has a great connecting stability, especially with respect to shearing forces.

According to one additional specific embodiment, the micromechanical component also has spacers between the first and the second substrate outside the opening. Because of the spacers, the two substrates may be positioned at a specified distance from each other. The specified distance offers the possibility, for example, of evaluating the motion of a functional element situated on the substrate with great accuracy capacitively via a reference electrode situated in the other substrate.

According to the exemplary embodiments and/or exemplary methods of the present invention, an additional micromechanical component is also proposed, which has a first and a second substrate. The first substrate has an opening, and the second substrate has a projecting patterned element. The first and the second substrate are connected in such a way that the projecting patterned element engages in the opening. The connection of the first and the second substrate is thereby produced by a connecting medium situated in the opening. The micromechanical component is distinguished by the opening of the first substrate including a floor region and side walls, the side walls having recesses bordering on the floor region which are filled up by the connecting medium. Moreover, the connecting medium is a eutectic alloy. In this micromechanical component, the filling up of the recesses in the opening by the connecting medium effects a wedge fastening or tooth structure, so that the component has a great connecting stability. A great connecting stability is favored in addition by the embodiment of the connecting medium as a eutectic alloy.

According to one specific embodiment, the projecting patterned element of the second substrate has a protective layer that is connected to the connecting medium. The protective layer makes for the possibility of avoiding the undesired melting of material of the patterned element during the production of the component by combining the two substrates.

According to yet one more specific embodiment, the micromechanical component also has an elevating pattern on the first substrate in the opening or on the projecting patterned element of the second substrate. The elevating pattern may function, for instance, as a mechanical stop, so as to prevent that the connecting medium from being completely forced out, during the connecting of the substrates, between the floor region of the opening of the first substrate and the projecting patterned element.

In the following text, the exemplary embodiments and/or exemplary methods of the present invention will be explained in greater detail with reference to the figures.

DETAILED DESCRIPTION

In a schematic lateral sectional representation, the following figures each show the production of a micromechanical component by connecting a functional substrate 100 and a cap substrate 200. In this way, a sensor region 135 developed on functional substrate 100, which has one or more movable functional elements and optionally integrated circuits, is able to be sealed hermetically from the environment. It is also conceivable for the cap substrate 200 to have integrated circuits. Sensor region 135 is only indicated in some of the figures shown. In the production methods that will be described below, usual method processes and materials may be used in semiconductor technology and microsystems technology, so that we shall go into these only partially. In addition, it is pointed out that, besides the method steps shown and described, additional method steps may be carried out in order to complete the production of a micromechanical component. Among these are, for example, the development of contacts on substrates 100, 200 for external contacting. What may also be considered is thinning substrates 100, 200 on their back surfaces and a separating process so as to provide micromechanical components that are separated from one another.

Figure 1:
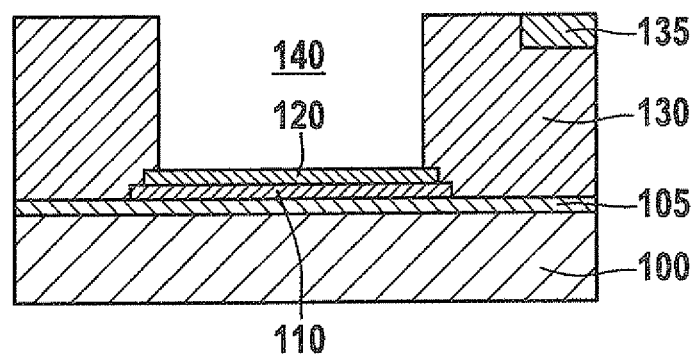
FIGS. 1, 2, and 3 show a method for producing a micromechanical component by connecting a functional substrate to, a groove and a cap substrate to a tenon-shaped pattern.
Figure 2:
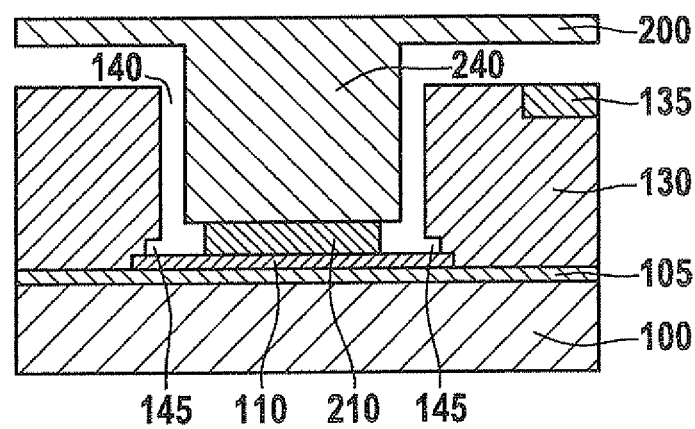
Figure 3:
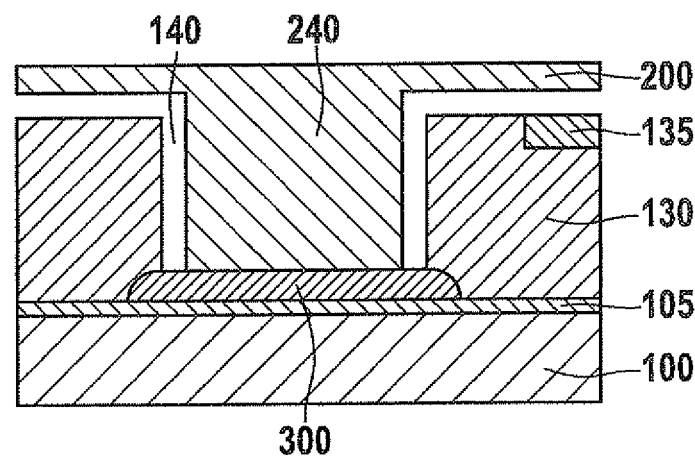

FIGS. 1 to 3 show a first method for producing a micromechanical component from a functional substrate 100 and a cap substrate 200. The micromechanical component may be, for instance, an acceleration sensor that can be used in a motor vehicle.

FIG. 1 shows a representation of a functional substrate 100 after carrying out a series of method steps. At the beginning, a substrate 100 is provided, which may be a common wafer made of silicon, for example. An insulating layer 105 having silicon oxide, for instance, is applied onto substrate 100. Instead of a single layer, insulating layer 105 may also include a plurality of layers. In particular, it is conceivable that one or more framed conductor track planes are provided within insulating layer 105. Such conductor track patterns are used to enable contacting the micromechanical components.

On insulating layer 105, a patterned connecting layer 110 is developed which, in a later method state, is used to form a eutectic alloy. As the material for connecting layer 110, one might consider silicon or polysilicon or germanium. Furthermore, on connecting layer 110, a patterned sacrificial layer 120 is developed which, as shown in FIG. 1, may have smaller lateral dimensions than connecting layer 110. Alternatively, sacrificial layer 120 may also have the same dimensions or even be larger than connecting layer 110. As the material for sacrificial layer 120, one might consider silicon oxide.

Onto this layer arrangement, a relatively thick functional layer 130 is applied, in which the functional elements of the micromechanical component are developed. A possible position or a region of the functional elements is indicated in FIG. 1 by sensor region 135. Functional layer 130 may be a so-called epi-polysilicon layer, that is, a polycrystalline silicon layer produced in an epitaxy method.

The production of functional elements in sensor region 135 includes, for example, the carrying out of a trench etching method, which is also designated as "trenching". For trench etching, one may carry out an alternating dry etching process such as the so-called Bosch process. Within the scope of trench etching, as shown in FIG. 1, an opening or groove 140 is developed in functional layer 130. For this, sacrificial layer 120 acts as an etching stop layer, in order to avoid damage to connecting layer 110. Groove 140 has a closed form (in a top view), which encircles sensor region 135.

A further process, which is carried out within the scope of producing the micropattern in sensor region 135, is a gas phase etching process. In this process, in which, for instance, hydrofluoric acid vapor is used, the functional elements of the micropattern that are prepatterned by trench etching, are exposed. With regard to groove 140, the gas phase etching results in sacrificial layer 120 being removed, as shown in FIG. 2, so that side walls of groove 140 adjacent to the floor region formed by connecting layer 110 have undercuttings or recesses 145. Recesses 145 contribute to increasing the connecting stability of the micromechanical component, as will be described further down.

FIG. 2 also shows cap substrate 200, which is connected to functional substrate 100 to produce the micromechanical component. Cap substrate 200 is used for sealing sensor region 135 hermetically from the environment.

FIG. 2 shows a representation of a cap substrate 200 after carrying out a series of method steps. At the beginning, a substrate 200 is provided, which may be a common wafer made of silicon, for example, as in the case of (original) substrate 100. Substrate 200 is further provided with a projecting tenon-shaped patterned element 240, which will be designated from here on as tenon pattern 240. A patterning method or etching method is used to produce tenon pattern 240. Tenon pattern 240 is adjusted to groove 140 of functional substrate 100 and therefore, same as groove 140, has a closed, circular form (in top view). Within the scope of patterning tenon pattern 240, a cavity is also developed on cap substrate 200, which is surrounded or framed by tenon pattern 240. After the connecting of substrates 100, 200, sensor region 135 of functional substrate 100 is situated inside the cavity.

As shown in FIG. 2, tenon pattern 240 is also developed to have a patterned connecting layer 210 situated on its lower side. Connecting layer 210 may be applied onto cap substrate 200 before, or alternatively after the patterning of tenon pattern 240, so that patterning of connecting layer 210 is able to take place within the scope of the patterning of tenon pattern 240 or by an additional patterning process. Counter to the representation in FIG. 2, connecting layer 210 may also extend over the entire width of tenon pattern 240 or rather its end face (lower side).

The material of connecting layer 210 of tenon pattern 240 is adjusted to the material of connecting layer 110 of functional substrate 100, in order to effect the formation of a eutectic alloy 300 from the two connecting layers 110, 210 (see FIG. 3). In the case of a connecting layer 110 containing silicon, connecting layer 210 may contain gold, for example, and in the case of germanium, for example, aluminum.

In order to connect the two substrates 100, 200, tenon pattern 240 is introduced into groove 140, as shown in FIG. 2, and an eutectic bonding process is carried out, in which substrates 100, 200 are pressed against each other under the influence of a specified temperature. The result is that connecting layers 110, 210 melt and form a eutectic alloy 300 (a eutectic), as shown in FIG. 3. Furthermore, by pressing together substrates 100, 200, it is achieved that eutectic 300 flows into recesses 145 and fills up recesses 145. In the process, a part of functional layer 130 may also melt in the vicinity of recesses 145 and, as indicated in FIG. 3, form a part of eutectic 300. This applies correspondingly to a subsection of tenon pattern 240 that is present before the melting under connecting layer 210 (in the representation of FIG. 2 "above" connecting layer 210).

After the cooling and the hardening of eutectic 300, the two substrates 100, 200 are connected to each other hermetically sealed via eutectic 300. The connecting of the two substrates 100, 200 may be carried out in a defined atmosphere having a specified atmospheric pressure (a very low one, for example), in order to set a defined inside pressure in the cavity framed by the two substrates 100, 200, in which sensor region 135 is situated.

The method described offers the possibility of realizing the connection between substrates 100, 200 via tenon pattern 240 engaging in groove 140, also designated as connecting frame or bonding frame, having small dimensions and particularly a small width. During the production of the patternings and layers participating in the eutectic bonding, photolithographic patterning processes and etching techniques may be used which make possible such miniaturization of the bonding frame. Moreover, based on tenon pattern 240, during the pressing of substrates 100, 200 against each other, a relatively great surface contact pressure is made possible in the region of connecting layers 110, 210, whereby (native) oxide layers that may be present on connecting layers 110, 210 are able to be broken up, and the melting of layers 110, 210 and the formation of eutectic 300 is able to occur relatively fast. The engaging of tenon pattern 240 in groove 140 further makes possible, even in the case of a relatively small bonding frame, a great connecting stability of the micromechanical component, above all, with respect to forces or shearing forces acting laterally between substrates 100, 200. The filling up of lateral recesses 145 of groove 140 by eutectic 300 also has the effect of wedge fastening or a tooth construction, whereby the stability of the connection is further advantaged.

With the aid of the following figures, modifications and variations are described of the production process explained in FIGS. 1 to 3. Therefore, for details of agreeing and corresponding process steps and components, we refer to the above explanations. In this regard, we should point out that features of individual specific embodiments may also be combined with other variants.

Figure 4:
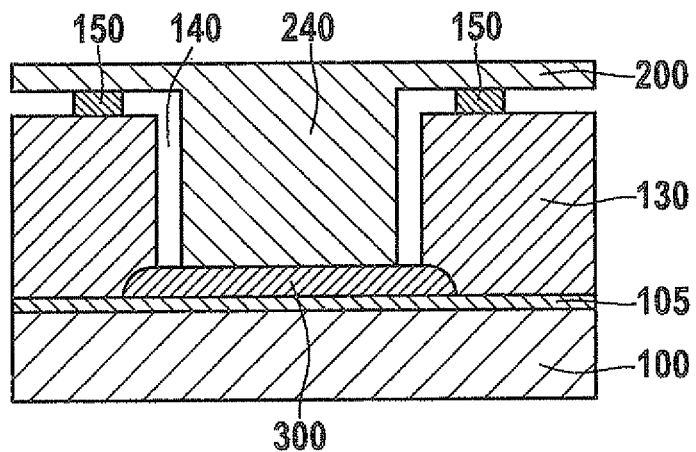
FIG. 4 shows an alternative embodiment of the production method, a spacer being used in addition.

FIG. 4 shows an alternative embodiment, spacers 150 being provided between functional substrate 100 or rather functional layer 130 and cap substrate 200 outside groove 140. The spacers 150 are produced before connecting substrates 100, 200. Producing spacers 150 includes, for instance, patterning functional layer 130 or applying an additional layer (made, for instance, of silicon oxide) onto functional layer 130 and patterning the additional layer.

Because of spacers 150, the two substrates 100, 200 may be positioned at a specified distance from each other. The specified distance, for instance, offers the possibility of detecting the position and the motion of a functional element of the micropatterning of functional substrate 100 capacitively at high accuracy via a reference electrode situated in cap substrate 200. Furthermore, spacers 150 may be used to establish a maximum measure of displacement for the molten eutectic 300 during connecting or pressing together substrates 100, 200. In this way it may particularly be assured that eutectic 300 is not completely squeezed out of the intermediate space between the lower side of tenon pattern 240 and insulating layer 105, which could possibly result in a deterioration of the adhesion and/or the sealing.

Instead of providing spacers 150 on functional substrate 100 or functional layer 130, one may also develop spacers 150 next to tenon pattern 240 on cap substrate 200. This may be done, for instance, by patterning cap substrate 200 or by applying an additional layer onto cap substrate 200 and patterning it. Moreover, it is also conceivable to connect the two substrates 100, 200 in such a way that the edge or surface of cap substrate 200 or a subsection thereof, indicated in the figures laterally of tenon pattern 240, lies on functional layer 130 (which is not shown). In this way, a specified distance between substrates 100, 200 may also be established, having the effects described above.

Figure 5:
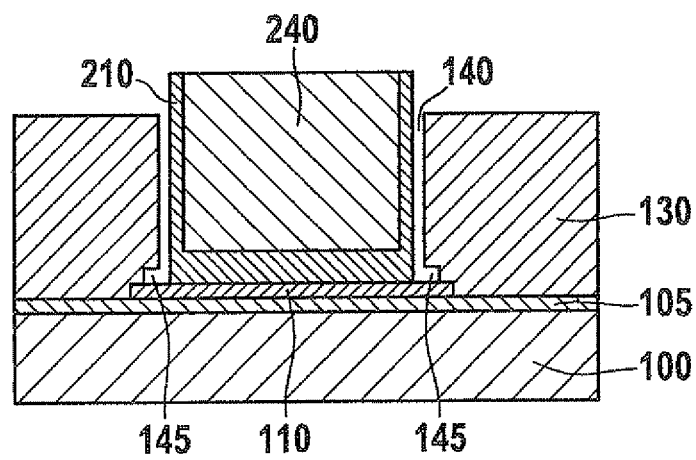
FIG. 5 shows a further alternative embodiment of the production method, a connecting layer also being situated on the side walls of the tenon-shaped pattern.

FIG. 5 shows a further alternative embodiment of the production method before the development of eutectic 300, connecting layer 210, in this instance, is not only provided on the lower side, but also on the side walls of tenon pattern 240. This makes it possible to omit a patterning process used, if necessary, for patterning connecting layer 210 (that is deposited over a large surface).

In the methods described above, the problem may exist that topographical differences between substrates 100, 200 effect only a partial or local contact between connecting layers 110, 210. This may lead to the case of eutectic 300 not developing in the entire connecting region within groove 140, and, as a result, there may be present a leakiness in the connecting region. Such an effect may be avoided by providing an elevating pattern functioning as a "sealing lip" in the connecting region, on which eutectic 300 is able to develop locally. Because of the pressing together of substrates 100, 200 carried out within the scope of the bonding, and the high surface contact force brought about in the vicinity of the elevating pattern, the molten eutectic 300 is able to be squeezed out further into other regions of the connecting frame, so the development comes about of a hermetically sealed connection in the entire connecting region. Possible specific embodiments having such an elevating pattern are shown in the following figures.

Figure 6:
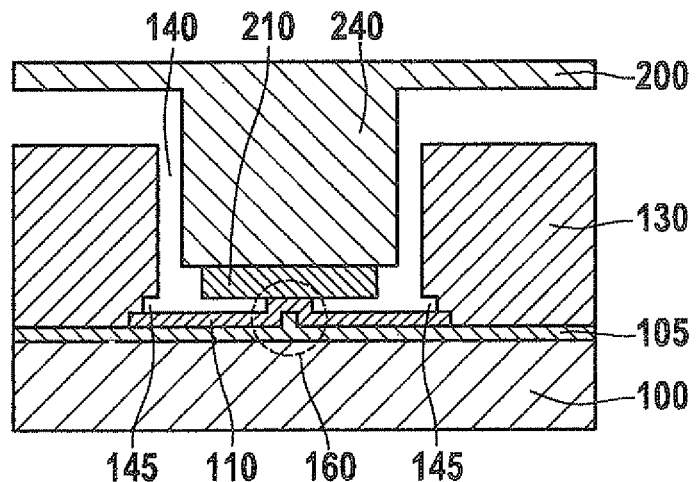
FIGS. 6 and 7 show a further embodiment of the production method, the functional substrate having an elevation in the groove.
Figure 7:
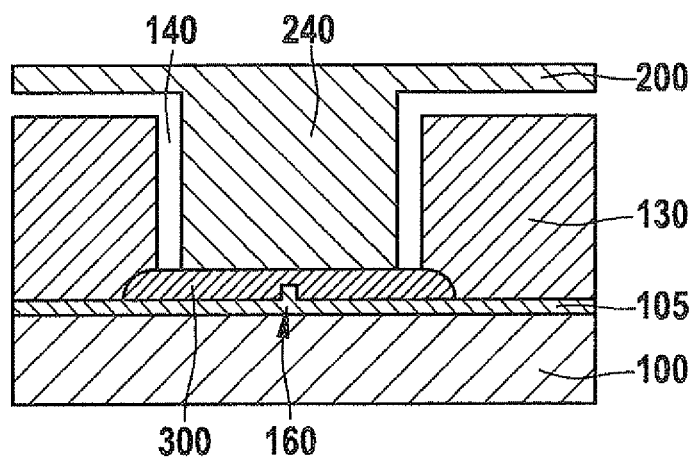

FIGS. 6 and 7 show an embodiment of the production method, an elevation 160 being provided within groove 140 on functional substrate 100, as shown in FIG. 6. This may be effected, for example, by additional patterning of insulating layer 105 originally applied onto (original) substrate 100 (or of one or more layers of insulating layer 105 constructed as a layer system), so that even connecting layer 110, developed subsequently on insulating layer 105, has a step-shaped form in the region of elevation 160. After eutectic 300 is produced, as shown in FIG. 7, elevation 160 (now formed entirely by insulating layer 105) is able to be enclosed by eutectic 300. In this connection, it is also conceivable that elevation 160 borders directly on the lower side of tenon pattern 240 (not shown).

Figure 8:
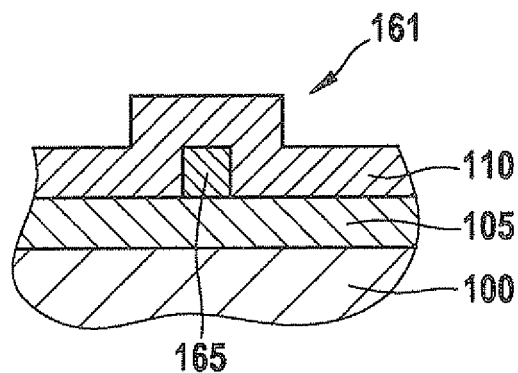
FIGS. 8, 9, and 10 show alternative embodiments of the elevating pattern of the functional substrate.

Such an elevation pattern (within groove 140) may then be realized in another way. One possible embodiment is elevation 161 shown in FIG. 8. In this instance, an additional patterned elevating layer 165 is developed on insulating layer 105. Elevating layer 165 may have a temperature-resistant material, to be used particularly in connection with subsequent processes carried out at high temperatures. Such a process is, for example, applying layer 130 as an epi-polysilicon layer by layer deposition in an epitaxial reactor. Possible temperature-resistant materials for elevation layer 165 are polysilicon, silicon nitride, silicon carbide or silicon oxide, for example.

Figure 9:
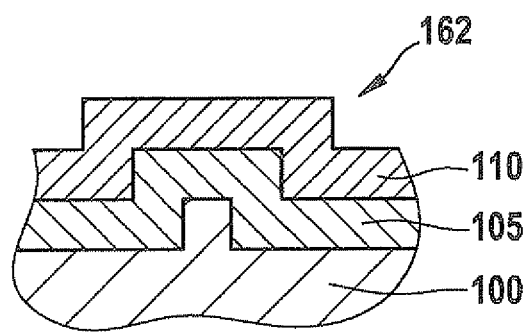
Figure 10:
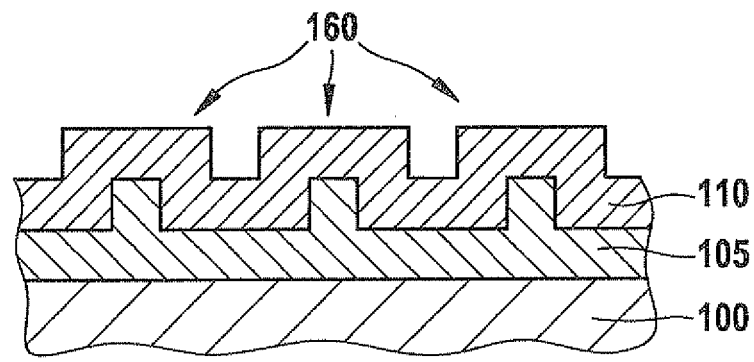

Alternatively, it is possible to pattern the supplied substrate 100, so as to provide an elevation 162, as shown in FIG. 9. In this instance, the subsequently developed layers 105, 110 have a corresponding step-shaped curve in the region of elevation 162. Instead of a single elevation, it is also conceivable to provide a plurality of elevations. To illustrate this, FIG. 10 shows a possible example, in which functional substrate 100 has three elevations 160. In this instance, elevations 160 may be situated at an equal distance and in parallel to one another. With regard to using elevating patterns, there exists the possibility of also combining these with spacers 150 shown in FIG. 4 (not shown here).

Figure 11:
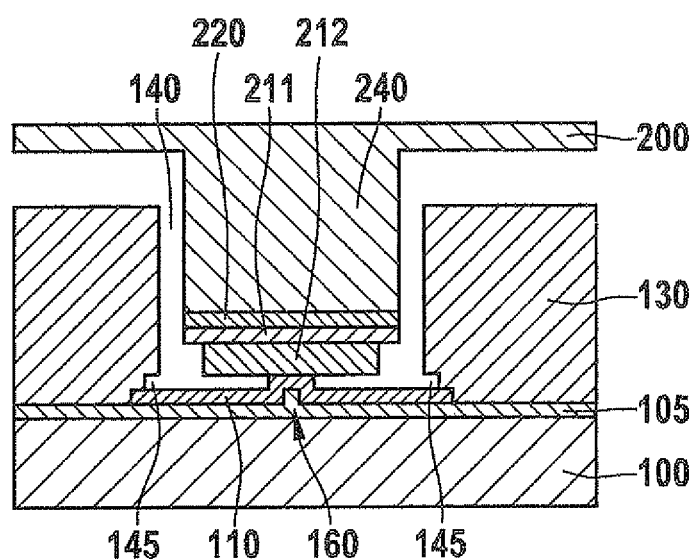
FIGS. 11 and 12 show a further variant of the method, the tenon-shaped pattern of the cap substrate having a protective layer and a two-layered connecting layer.
Figure 12:
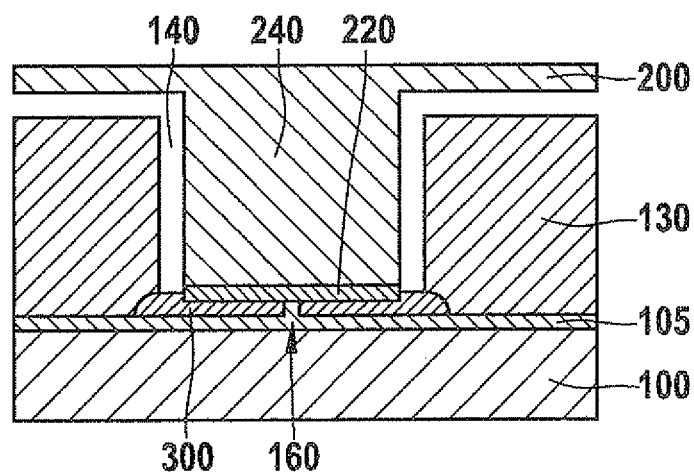

FIGS. 11 and 12 show an additional embodiment of the production method. In this instance, tenon pattern 240, as shown in FIG. 11, is provided with an additional protective layer 220, which has silicon oxide, for example. In addition, as the connecting layer of tenon pattern 240, a layer system made up of two layers 211, 212 is provided, which are situated on protective layer 220. This two-layered construction has the purpose of achieving an improved adhesion on protective layer 220.

As the material for connecting layer 212 (corresponding to connecting layer 210 shown in the previous figures) gold may be considered, which may, however, demonstrate insufficient adhesion to a protective layer 220 formed of silicon oxide, especially during melting within the scope of eutectic bonding. Such an adhesion problem may be avoided by an additional connecting layer 211 situated between connecting layer 212 and protective layer 220, which has silicon, for instance, same as connecting layer 110 on functional substrate 100. Corresponding circumstances may also exist for a connecting layer 212 including aluminum on a protective layer 220 including silicon oxide. In this instance, improved adhesion may be achieved by a connecting layer 211 made up of germanium. However, alternatively it is also conceivable to provide only a single connecting layer on protective layer 220, depending on the materials involved.

During the course of the eutectic bonding, connecting layer 110 forms a eutectic 300 with connecting layers 211, 212 and tenon pattern 240, which flows into recesses 145 of groove 140, as shown in FIG. 12. In this instance, protective layer 220 is used to avoid the melting of material of tenon pattern 240 under the protective layer, so that eutectic 300 is able to be produced having an essentially specified mixture ratio.

In addition, protective layer 220, together with elevation 160 that is also provided in the production method of FIGS. 11 and 12, is able to form a mechanical stop (see FIG. 12). In this manner too, a maximum displacement of molten eutectic 300 is able to be specified during the connecting and pressing together of substrates 100, 200, in order to prevent an inclusive displacement of eutectic 300 from the intermediate region between the lower side of tenon pattern 240 or its protective layer 220 and insulating layer 105. Alternatively, the possibility also exists of inserting tenon pattern 240, shown in FIG. 11, together with layers 211, 212, 220 into a groove 140 not having an elevation, a mechanical stop being able to be effected by spacers 150 corresponding to the specific embodiment shown in FIG. 4.

Figure 13:
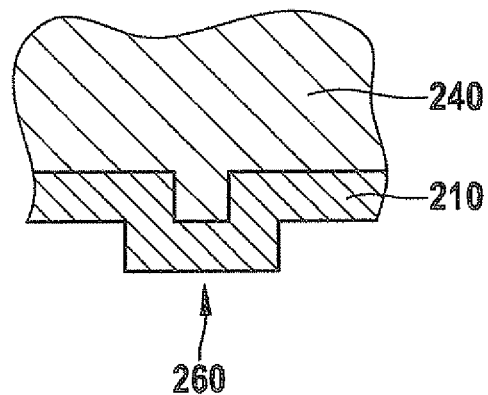
FIG. 13 show a representation of a tenon-shaped pattern having an elevation.

Besides on functional substrate 100, an elevation may also be provided additionally or alternatively on cap substrate 200 or on tenon pattern 240. One possible embodiment is represented in FIG. 13. In this instance, the lower side of tenon pattern 240 or of the region of substrate 200, on which it is based, is patterned, in order to provide an elevation 260. A connecting layer 210 provided on tenon pattern 240 therefore has a step-shaped curve in the vicinity of elevation 260. In the same way as the abovementioned elevations 160, 161, 162, elevation 260 of tenon pattern 240 is also able to function on functional substrate 100 as a "sealing lip", in order to make possible a reliable connection of substrates 100, 200, in spite of topographical differences.

Figure 14:
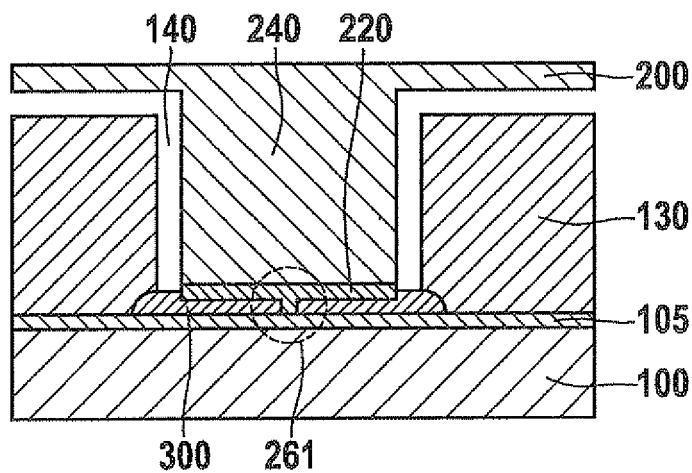
FIG. 14 show an additional embodiment of the production method having a tenon-shaped pattern that has an elevation.

FIG. 14 shows an additional embodiment having an elevation provided on tenon pattern 240. Elevation 261 is provided by patterning a protective layer 220 of tenon pattern 240, in this instance. Before the production of the connection of substrates 100, 200 via eutectic 300, shown in FIG. 14, according to the embodiment of FIG. 11, two connecting layers 211, 212 may be situated on protective layer 220 which, in the vicinity of elevation 261, have a step-shaped form (not shown). Because of elevation 261, protective layer 220 together with insulating layer 105 is able to form a defined stop, in order to specify a maximum displacement measure for molten eutectic 300.

Additional alternative embodiments are imaginable, also with regard to elevations 260, 261 shown in FIGS. 13 and 14, in the vicinity of tenon pattern 240. It is possible, in particular, to generate an elevation by an additionally patterned elevation layer, or even a plurality of elevations on the lower side of a tenon pattern 240. For further details, we point to the above statements on elevations 160, 161, 162 on functional substrate 100. Furthermore, here too there exists the possibility of a combination with spacers 150 between substrates 100, 200 outside groove 140 (not shown).

In the methods described above, the formation of eutectic 300 takes place by the melting of connecting layers 110, 210, 211, 212 developed on functional substrate 100 and on cap substrate 200. Alternatively, there is the possibility of leaving out a connecting layer 110 situated on functional substrate 100, and of producing a connection directly to the substrate material on its surface.

Figure 15:
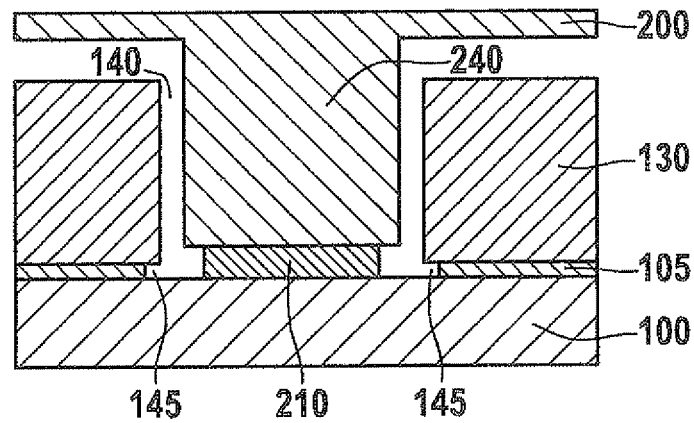
FIGS. 15 and 16 show an additional embodiment of the production method, the connection taking place directly over the functional substrate.
Figure 16:
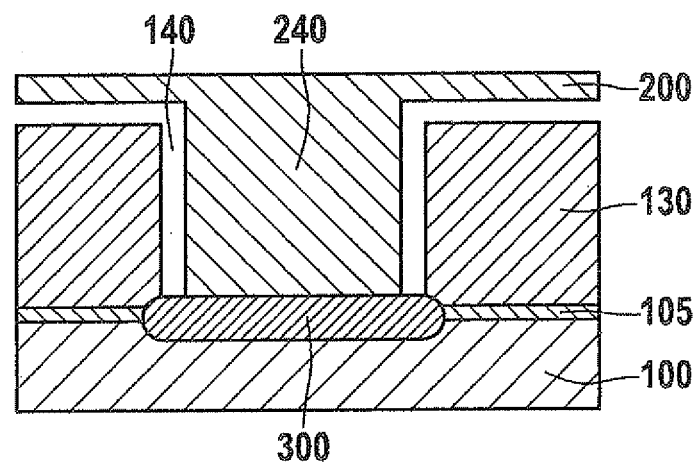

To illustrate this, FIGS. 15 and 16 show a possible embodiment of such a method. As shown in FIG. 15, functional substrate 100 is produced, in this instance, having a patterned insulating layer 105 and a patterned functional layer 130 which provide a groove 140, the (silicon) surface of (original) substrate 100 being exposed in the floor region of groove 140. Once again, groove 140 has lateral undercutting or recesses 145. Such a patterning may, for instance, be developed in that first a layer system is produced on provided substrate 100, having an insulating layer 105 and a functional layer 130, and subsequently trench etching is carried out for patterning functional layer 130 and a gas phase etching for removing a part of insulating layer 105.

In order to connect the two substrates 100, 200, tenon pattern 240, which has a connecting layer 210 on its lower side, is introduced into groove 140, and an eutectic bonding process is carried out, in which substrates 100, 200 are pressed against each other under the influence of a specified temperature. This has the result that connecting layer 210 and a part of the material of substrate 100 melt at the exposed surface in groove 140, and together form a eutectic 300, as shown in FIG. 16. Furthermore, by pressing together substrates 100, 200, it is achieved that eutectic 300 flows into recesses 145 and fills up recesses 145. For such an eutectic reaction, connecting layer 210 may have gold, for instance, which is able to melt together with the silicon of substrate 100. In the formation of eutectic 300, a part of, functional layer 130 may also take part in the vicinity of recesses 145, and so may a subsection of tenon pattern 240 present before the melting, under connecting layer 210.

Figure 17:
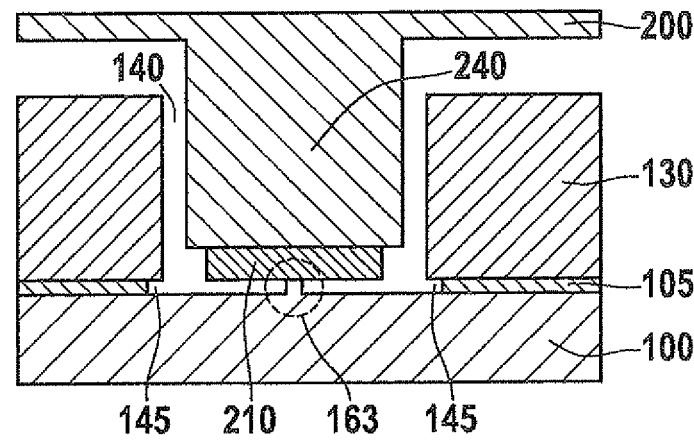
FIG. 17 show a variant of the method having an elevation on the functional substrate.

FIG. 17 illustrates a variant of the direct connection with substrate material at the surface of substrate 100. In this instance, the exposed surface of substrate 100 is patterned, so that an elevation 163 is provided. In this instance, elevation 163 is again able to function as a "sealing lip" in order to enable a reliable connecting of substrates 100, 200 in spite of topographical differences. After the connecting of substrates 100, 200, elevation 163 may have "become taken up" in eutectic 300 formed, so that a pattern corresponding to FIG. 16 may be present. Instead of a single elevation 163, a plurality of elevations may also be provided on the exposed surface of substrate 100.

Figure 18:
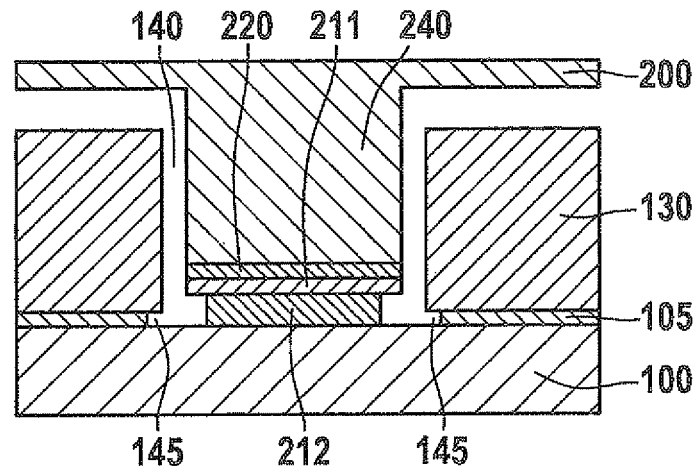
FIGS. 18 and 19 show a further embodiment of the production method, the tenon-shaped pattern of the cap substrate having a protective layer and a two-layered connecting layer.
Figure 19:
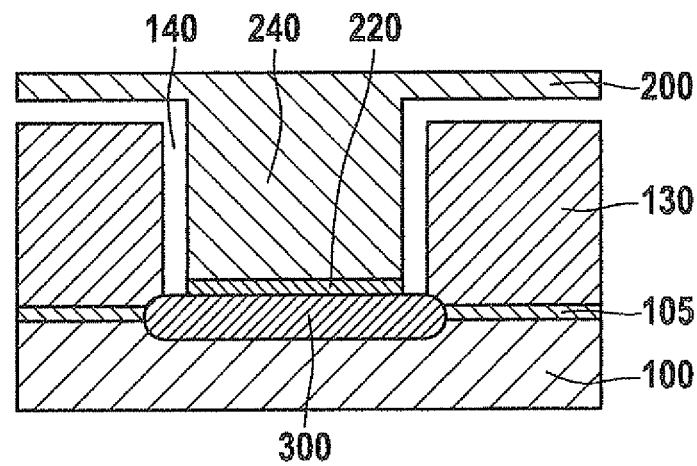

FIGS. 18 and 19 show a further possible specific embodiment of the direct connection to substrate material at the surface of substrate 100, the tenon pattern 240 of cap substrate 200 being provided with a protective layer 220 and two connecting layers 211, 212, in this case. In this instance, because of protective layer 220, the undesired melting of material of tenon pattern 240 during the formation of eutectic 300 may be prevented, and because of the two layers 211, 212, improved adhesion on protective layer 220 may be achieved.

It is also imaginable, with respect to the methods illustrated in FIGS. 15 to 19, that one might additionally provide spacers between substrates 100, 200 outside groove 140, in order to connect substrates 100, 200 at a specified distance from each other (not shown). In this way, one may again specify a maximum measure for the displacement of eutectic 300 formed from layer 210 or layers 211, 212 and the substrate material of substrate 100. In addition, the lower side of tenon pattern 240 or its protective layer 220 may be provided with an elevation corresponding to FIGS. 13 and 14 (not shown).

In the methods described above, functional substrate 100 has a groove 140 in which a tenon pattern 240 of cap substrate 200 engages. Alternatively, there is the possibility of omitting such a groove 140 and of connecting tenon pattern 240 to functional substrate 100 without collaboration with a groove 140. Besides providing, or rather enclosing a cavity, tenon pattern 240 may, if necessary, be used for breaking up of (native) oxide layers, which may be present on connecting layers 110, 210.

Figure 20:
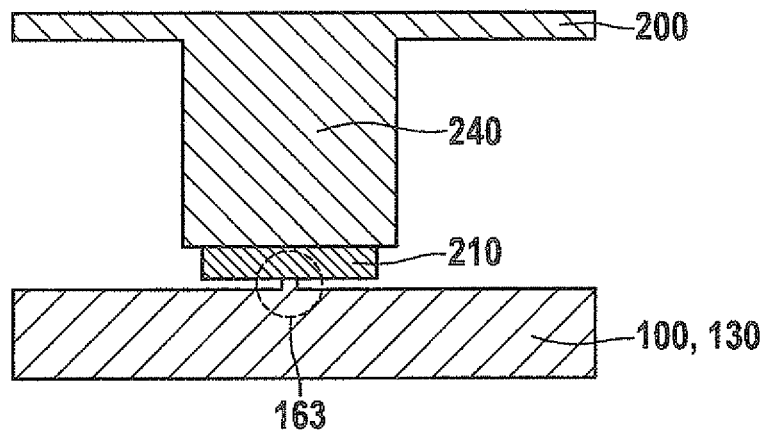
FIG. 20 show a further embodiment of the production method, the functional substrate having an elevation but no groove.

To illustrate this, FIG. 20 shows a possible specific embodiment, in which no groove 140 is developed on functional substrate 100. In this case, tenon pattern 240 having a connecting layer 210 situated on the lower side is connected directly to the surface of functional substrate 100, so that after the connection of substrates 100, 200, an embodiment comes about (without groove 140) that is comparable to FIG. 16. Instead of producing the eutectic connection to a surface of substrate 100, there is alternatively the possibility of producing the connection to a functional layer 130 that is developed on substrate 100. In addition, it is possible to develop an elevation 163 on substrate 100 or on functional layer 130, as indicated in FIG. 20, which functions as a "sealing lip" for equalizing the topographical differences.

Figure 21:
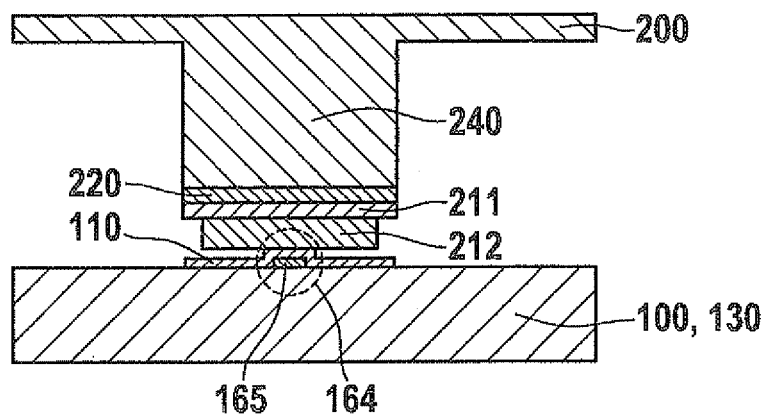
FIGS. 21 and 22 show a variant of the method, the tenon-shaped pattern of the cap substrate having a protective layer and a two-layered connecting layer.
Figure 22:
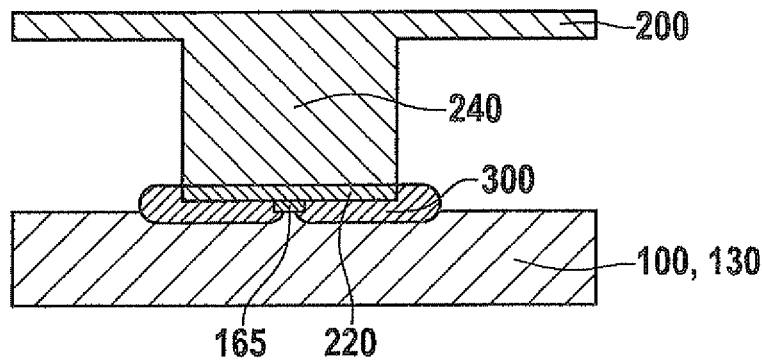

FIGS. 21 and 22 show an additional possible embodiment of a production method. In this instance, tenon pattern 240 is shown as in FIG. 21, having a protective layer 220 and two connecting layers 211, 212 developed. Protective layer 220 prevents, in this instance, an undesired melting of material of tenon pattern 240 during the development of an eutectic 300. The two-layered construction having connecting layers 211, 212 is used so as to achieve improved adhesion on protective layer 220. Furthermore, an additional connecting layer 110 is situated on functional substrate 100 or on a functional layer 130 situated on substrate 100. Functional substrate 100 also has an elevation 164 which is formed, for instance, with the aid of a patterned elevating layer 165. After the production of substrates 100, 200 via eutectic 300, elevating layer 165 may continue to be present in the connecting range between substrates 100, 200, as shown in FIG. 22.

In the methods described with the aid of FIGS. 1 to 22, the connecting between a functional substrate 100 and a cap substrate 200 takes place based on eutectic bonding. The connecting of the two substrates 100, 200 may, however, also take place in a different way.

Figure 23:
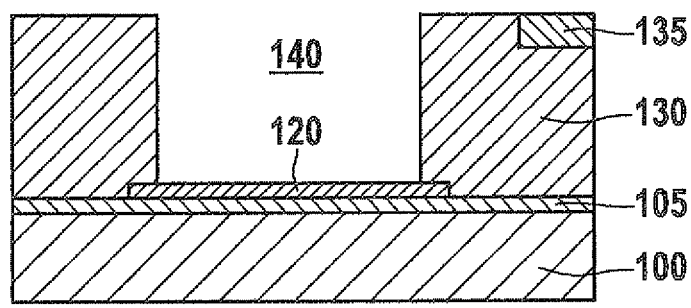
FIGS. 23, 24, and 25 show an additional method for producing a micromechanical component by connecting a functional substrate to a groove and a cap substrate to a tenon-shaped pattern.
Figure 24:
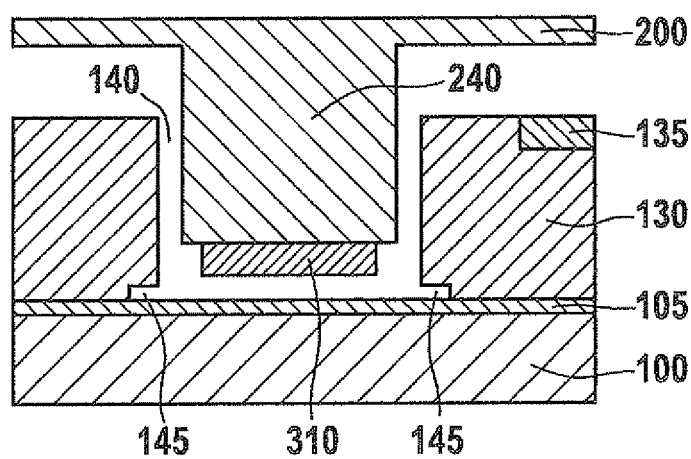
Figure 25:
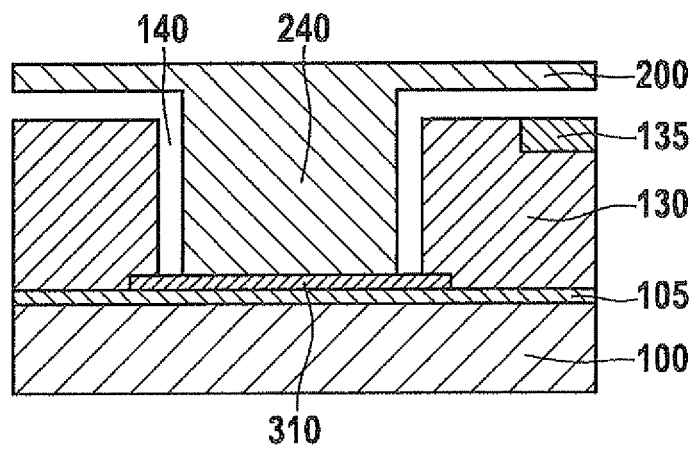

FIGS. 23 to 25 show a further method of producing a micromechanical component from a functional substrate 100 and a cap substrate 200. The micromechanical component may again be an acceleration sensor, for example, which may be used in a motor vehicle.

FIG. 23 shows a representation of a functional substrate 100 after the carrying out of a series of method steps. At the beginning, a substrate 100 is provided, which may be a common silicon wafer, for example. An insulating layer 105 having silicon oxide, for instance, is applied onto substrate 100. Instead of a single layer, insulating layer 105 may also include a plurality of layers. Moreover, within insulating layer 105, one or more framed conductor track planes may be provided in order to enable the contacting of the micromechanical component.

A patterned sacrificial layer 120 is developed on insulating layer 105, the former having silicon oxide, for example. Onto this layer arrangement, a relatively thick functional layer 130 is applied, in which the functional elements of the micromechanical component are developed. A possible position or a region of the functional elements is indicated in FIG. 23 by sensor region 135. Functional layer 130 may be an epi-polysilicon layer.

The production of functional elements in sensor region 135 includes carrying out a trench etching method, for instance, a trenching in the course of which, as shown in FIG. 23, an opening or groove 140 is developed in functional layer 130, which has a closed form (in a top view) and runs around sensor region 135. In this instance, sacrificial layer 120 may function as an etching stop layer.

An additional process carried out within the scope of producing the micropattern in sensor region 135 is a gas phase etching process (for instance, using hydrofluoric acid vapor), in order to expose the functional elements of the micropattern prepatterned by the trench etching. With regard to groove 140, the gas phase etching results in sacrificial layer 120 being removed, as shown in FIG. 24, so that side walls of groove 140 adjacent to the floor region formed by insulating layer 105 have undercuttings or recesses 145.

FIG. 24 also shows cap substrate 200, which is connected to functional substrate 100 to produce the micromechanical component. Cap substrate 200 is used for sealing sensor region 135 hermetically from the environment.

FIG. 24 shows a representation of a cap substrate 200 after carrying out a series of method steps. At the beginning, a substrate 200 is provided, which may be a common wafer made of silicon, for example, as in the case of (original) substrate 100. Substrate 200 is furthermore provided with a projecting tenon pattern 240, which is produced using a patterning method or etching method. Tenon pattern 240 is adjusted to groove 140 of functional substrate 100 and therefore, same as groove 140, has a closed, circular form (in top view). Because of the patterning of tenon pattern 240, a cavity is also developed on cap substrate 200, which is framed by tenon pattern 240.

After the connecting of substrates 100, 200, sensor region 135 of functional substrate 100 is situated inside the cavity.

On the lower side, tenon pattern 240 is also provided with a connecting medium 310. As the material for connecting medium 310, solder may be considered, which in particular includes a metal alloy (for instance, gold-silicon or aluminum-germanium) applied in the eutectic ratio. To apply such a connecting medium 310, a sputtering process may be carried out, for example. In such a case, connecting medium 310 may be applied onto cap substrate 200 before, or alternatively after the patterning of tenon pattern 240, so that patterning of connecting medium 310 is able to take place within the scope of the patterning of tenon pattern 240 or by an additional patterning process. It is also possible to do without patterning of connecting medium 310 (applied onto tenon pattern 240), so that connecting medium 310 is also able to cover side walls of tenon pattern 240 (not shown). Alternatively, it may be imagined that one use Sealglas or an adhesive for connecting medium 310. Such materials may be applied onto tenon pattern 240 by a silk-screen process or a dispensing process, To connect the two substrates 100, 200, tenon pattern 240 is inserted into groove 140, as shown in FIG. 24, and the two substrates 100, 200 are pressed against each other, so that connecting medium 310 is displaced, as shown in FIG. 25, and is pressed into recesses 145. Depending on the material of connecting medium 310, this process may be carried out at a specified temperature, so that, for instance, when a metallic solder is used as connecting medium 310, melting takes place. After solidifying or hardening of connecting medium 310, the two substrates 100, 200 are connected to each other hermetically tightly. The described connecting of the two substrates 100, 200 may be carried out in a defined atmosphere having a specified atmospheric pressure (a very low one, for example), in order to set a defined inside pressure in the cavity framed by the two substrates 100, 200, in which sensor region 135 is situated.

The engaging of tenon pattern 240 in groove 140 makes possible a great connecting stability of the micromechanical component, above all, with respect to forces or shearing forces acting laterally between substrates 100, 200. The filling up of lateral recesses 145 of groove 140 by the connecting medium also has the effect of wedge fastening or a tooth construction, whereby the stability of the connection is further advantaged.

When a metallic solder is used as connecting medium 310, it is furthermore of advantage that melting of connecting medium 310 and the formation of a melt is effected, even when substrates 100, 200 (locally) do not touch each other directly. In this way, the molten connecting medium 310, even in the case of topographical differences or even in the presence of particles between the substrates 100, 200 which, perhaps prevent a direct contact, may run off into groove 140 and recesses 145, so that a tight connection is able to be produced between the substrates 100, 200.

With the aid of the following figures, modifications and variations are described of the production process explained in FIGS. 23 to 25. Therefore, for details of agreeing and corresponding process steps and components, we refer to the above explanations. In this regard, we should also point out that features of individual specific embodiments may also be combined with other variants. This applies correspondingly to features of the methods explained with the aid of FIGS. 1 to 22.

Figure 26:
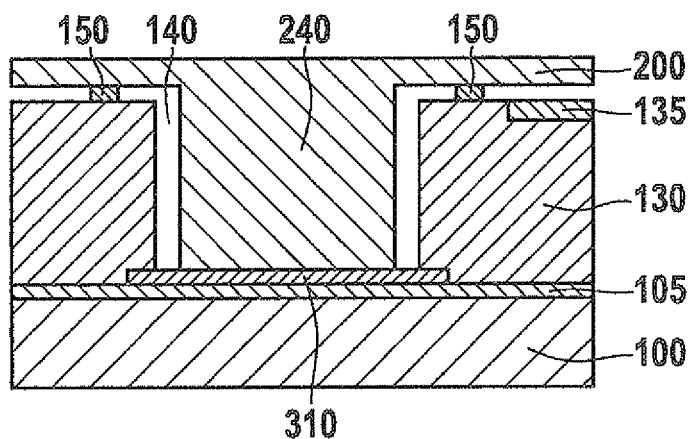
FIG. 26 show an alternative embodiment of the production method, spacers being used in addition.

FIG. 26 shows an alternative embodiment, spacers 150 being provided between functional substrate 100 or rather functional layer 130 and cap substrate 200 outside groove 140. The spacers 150 are produced before connecting substrates 100, 200. Producing spacers 150 includes, for instance, patterning functional layer 130 or applying an additional layer (made, for instance, of silicon oxide) onto functional layer 130 and patterning the additional layer.

Because of spacers 150, the two substrates 100, 200 may be positioned at a specified distance from each other. The specified distance, for instance, offers the possibility of detecting the position and the motion of a functional element of the micropatterning of functional substrate 100 capacitively, at high accuracy, via a reference electrode situated in cap substrate 200. Furthermore, spacers 150 may be used to establish a maximum measure of displacement for connecting medium 310 during connecting or pressing together substrates 100, 200. In this way it may particularly be assured that connecting medium 310 is not completely squeezed out of the intermediate space between the lower side of tenon pattern 240 and insulating layer 105, which could possibly result in a deterioration of the adhesion and/or the sealing.

Instead of providing spacers 150 on functional substrate 100 or functional layer 130, one may also develop spacers 150 next to tenon pattern 240 on cap substrate 200. This may be done, for instance, by patterning cap substrate 200 or by applying an additional layer onto cap substrate 200 and patterning it. Moreover, it is also conceivable to connect the two substrates 100, 200 in such a way that the edge or surface of cap substrate 200 or a subsection thereof, indicated in the figures laterally of tenon pattern 240, lies on functional layer 130 (which is not shown). In this way, a specified distance between substrates 100, 200 may also be established, having the effects described above.

Figure 27:
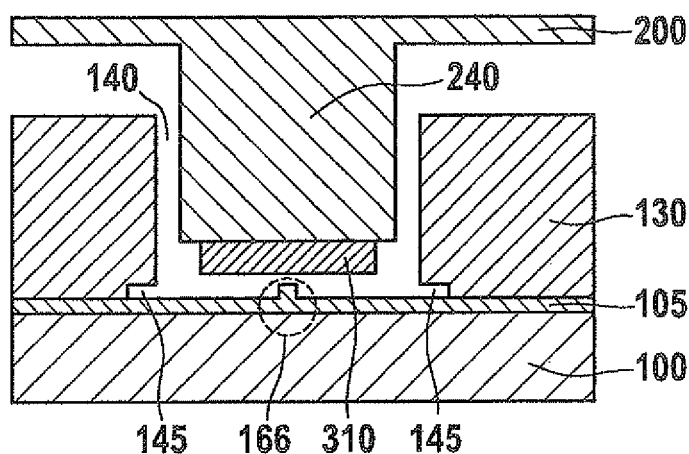
FIGS. 27 and 28 show a further embodiment of the production method, the functional substrate having an elevation in the groove.
Figure 28:
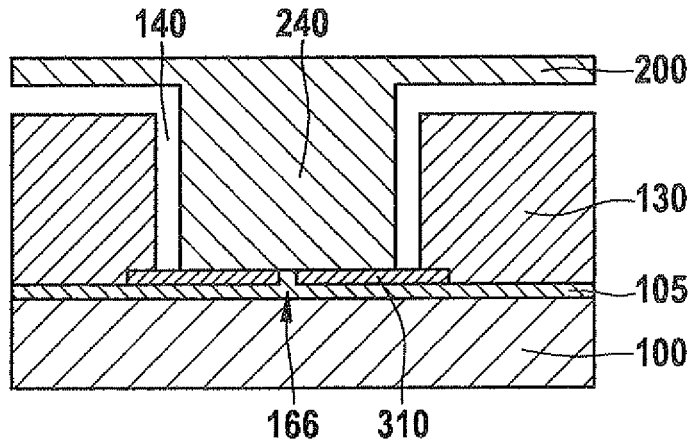

FIGS. 27 and 28 show another embodiment of the production method before and after connecting substrates 100, 200. For this, an elevation 166 is additionally provided on functional substrate 100. Elevation 166 is used to specify a defined distance and a mechanical stop between substrates 100, 200. In this way, in a corresponding manner to spacers 150, a (maximum) measure may be established for the displacement of connecting medium 310 during the connecting of substrates 100, 200. Elevation 166 is produced, for instance, by additional patterning of insulating layer 105 applied to (original) substrate 100 (or one or more layers of insulating layer 105 built up as a layer system). In addition, elevation 166 may also function as a "sealing lip", in order to achieve a hermetically tight connection in the entire connecting range, in spite of topographical differences between substrates 100, 200.

Figure 29:
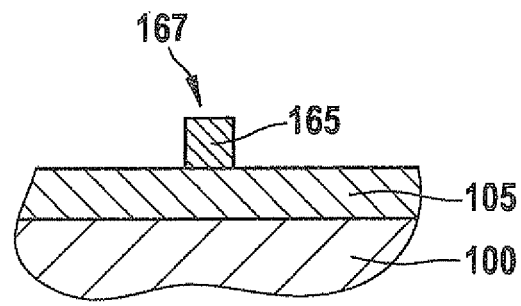
FIGS. 29, 30, and 31 show alternative embodiments of the elevating pattern of the functional substrate.

Such an elevation pattern (within groove 140) may also be realized in another way. One possible embodiment is elevation 167 shown in FIG. 29, which is made available by a patterned elevating layer 165 developed on insulating layer 105. Elevating layer 165 may have a temperature-resistant material, to be used particularly in connection with subsequent processes carried out at high temperatures (for example, applying layer 130 in an epitaxial reactor). Possible temperature-resistant materials for elevation layer 165 are polysilicon, silicon nitride, silicon carbide or silicon oxide, for example.

Figure 30:
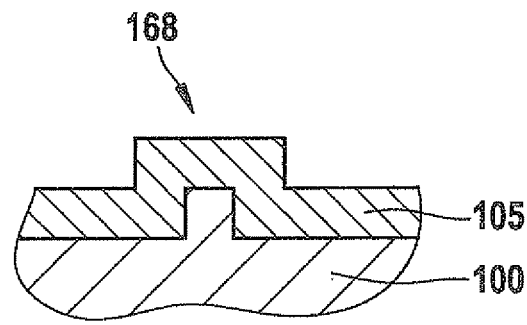
Figure 31:
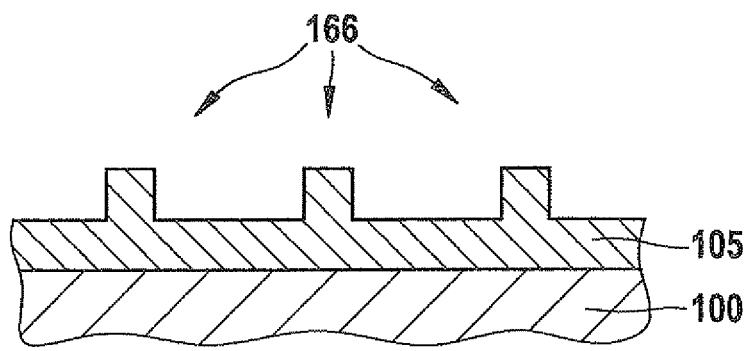

Furthermore, it is conceivable to pattern the supplied substrate 100, so as to provide an elevation 168, as shown in FIG. 30. In this instance, subsequently developed insulating layer 105, has a corresponding step-shaped curve in the region of elevation 162. FIG. 31 shows an additional possible embodiment, in which several, that is three, for instance, elevations 166, that are situated at an equal distance and parallel to one another, are provided on functional substrate 100.

Figure 32:
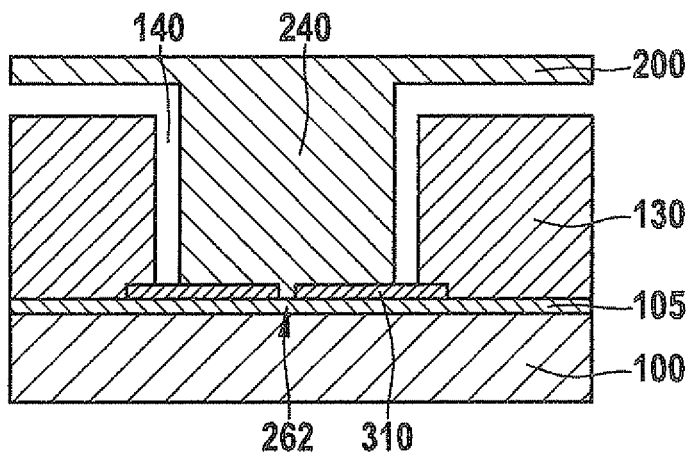
FIGS. 32, 33, and 34 show additional variants of the production method, an elevation and/or a protective layer being used.

Besides on functional substrate 100, an elevation may also be provided additionally or alternatively on cap substrate 200 or on tenon pattern 240. One possible embodiment is represented in FIG. 32. In this instance, the lower side of tenon pattern 240 is patterned so as to provide an elevation 262. Elevation 262 of tenon pattern 240 may also function to provide a mechanical stop as well as to act as a "sealing lip". With regard to the use of elevation patterns on functional substrate 100 in groove 140 and/or on tenon pattern 240 of cap substrate 200, there is the possibility of also combining these with spacers 150 shown in FIG. 26 (not shown here).

Figure 33:
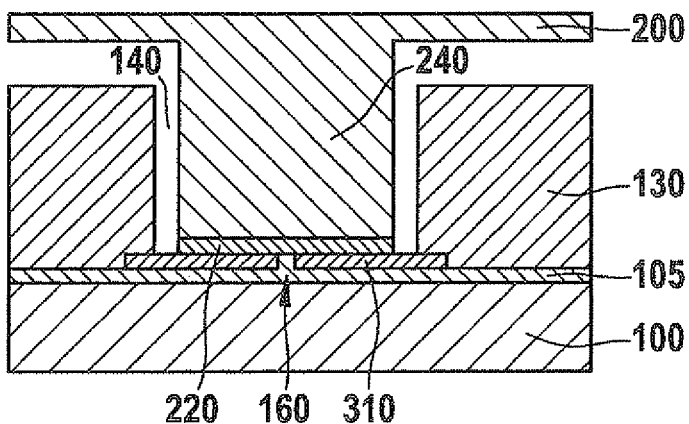

FIG. 33 shows a further specific embodiment of the production method. In this instance, tenon pattern 240, as shown in FIG. 11, is provided with an additional protective layer 220, which has silicon oxide, for example. Before production of the system shown in FIG. 33, connecting medium 310 is situated on this protective layer 220. In this instance, protective layer 220 is able to prevent an undesired melting of material of tenon pattern 240, which could happen, for example, if a gold-silicon eutectic is used as connecting medium 310.

Figure 34:
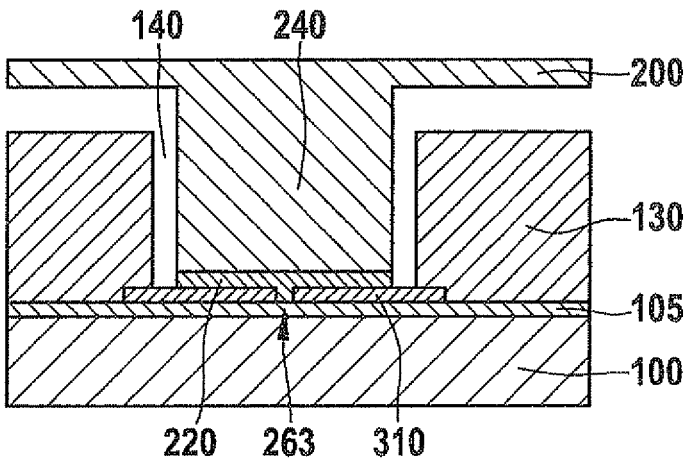

A further variant is shown in FIG. 34. In this instance, protective layer 220 of tenon pattern 240 is patterned additionally, so as to provide an elevation 263. In this way, protective layer 220 additionally has the abovementioned function as a mechanical stop as well as a "sealing lip", if necessary.

The specific embodiments, explained with the aid of the figures, represent exemplary specific embodiments of the present invention. Instead of the specific embodiments described, additional specific embodiments are conceivable, which may include further modifications or combinations. In addition, it is possible to develop a projecting tenon pattern on a functional substrate (for instance, by patterning a functional layer), and to connect such a functional substrate to a cap substrate via the tenon pattern. In this instance, the cap substrate may perhaps have an opening or groove into which the tenon pattern engages. The methods described above may be used in a corresponding fashion even in such a specific embodiment.

What is claimed is:

1. A micromechanical component, comprising:
   a first substrate;
   a second substrate having a projecting patterned element;
   an eutectic alloy; and
   an elevation pattern on the first substrate or on the projecting patterned element of the second substrate;
   wherein the first substrate and the second substrate are connected to each other with the eutectic alloy by eutectic bonding of the projecting patterned element to the first substrate such that the elevation pattern is enclosed by the eutectic alloy, wherein the elevation pattern projects into and is in direct contact with the eutectic alloy.

2. A micromechanical component, comprising:
   a first substrate having a functional layer disposed thereon leaving a circular area on the first substrate such that the circular area and the functional layer provide an opening with the circular area as a floor region and the functional layer as a sidewall; and
   a second substrate having a projecting patterned element, the first substrate and the second substrate being connected so that the projecting patterned element is inside the opening, wherein the first substrate and the second substrate are connected by a connecting medium situated in the opening;
   wherein the sidewall has a recess adjacent to the floor region, which is filled up by the connecting medium, and the connecting medium is an eutectic alloy.

3. The micromechanical component of claim 2, wherein the first substrate has an insulating layer disposed thereon and wherein the insulating layer is connected to the connecting medium.

4. The micromechanical component of claim 2, wherein the projecting patterned element of the second substrate has a protective layer disposed thereon and wherein the protective layer is connected to the connecting medium.

5. The micromechanical component of claim 2, further comprising:
   spacers between the first substrate and the second substrate.

6. The micromechanical component of claim 2, further comprising:
   an elevation pattern on the first substrate in the opening or on the projecting patterned element of the second substrate.

* * * * *